United States Patent
Yu

(10) Patent No.: US 6,214,654 B1
(45) Date of Patent: Apr. 10, 2001

(54) METHOD FOR FORMING SUPER-STEEP RETROGRADED CHANNEL (SSRC) FOR CMOS TRANSISTOR USING RAPID LASER ANNEALING TO REDUCE THERMAL BUDGET

(75) Inventor: Bin Yu, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/238,358

(22) Filed: Jan. 27, 1999

(51) Int. Cl.$^7$ .................... H01L 21/338; H01L 21/336
(52) U.S. Cl. ............... 438/185; 438/217; 438/278; 438/290
(58) Field of Search .................... 438/183, 185, 438/174, 175, 194, 217, 278, 290; 257/348, 330

(56) References Cited

U.S. PATENT DOCUMENTS

| | | | |
|---|---|---|---|
| 5,899,732 | * 5/1999 | Gardner et al. | 438/473 |
| 5,917,219 | * 6/1999 | Nandakumar et al. | 257/348 |
| 5,960,270 | * 9/1999 | Misra et al. | 438/197 |
| 6,017,781 | * 1/2000 | Shimizu et al. | 438/158 |
| 6,054,355 | * 4/2000 | Inumiya et al. | 438/296 |
| 6,124,188 | * 9/1999 | Gardner et al. | 438/585 |
| 6,150,693 | * 11/2000 | Wollesen | 257/330 |

\* cited by examiner

Primary Examiner—Olik Chaudhuri
Assistant Examiner—William David Coleman
(74) Attorney, Agent, or Firm—Lariviere, Grubman & Payne, LLP

(57) ABSTRACT

A method for making a ULSI MOSFET chip includes forming a sacrificial gate on a substrate along with activated source and drain regions, but without initially establishing a doped channel region. The polysilicon portion of the sacrificial gate is then removed and a neutral ion species such as Silicon or Germanium is implanted between the source and drain regions in the region that is to become the doped channel region. A dopant substance is next implanted into the channel region, which is then exposed to ultra-rapid thermal annealing to cause the dopant to form a box-like, super-steep retrograded channel profile. The gate is then re-formed over the now activated doped channel region.

10 Claims, 3 Drawing Sheets

METHOD FOR FORMING SUPER-STEEP RETROGRADED CHANNEL (SSRC) FOR CMOS TRANSISTOR USING RAPID LASER ANNEALING TO REDUCE THERMAL BUDGET

TECHNICAL FIELD

The present invention relates generally to semiconductor fabrication, and more particularly to methods for fabricating improved ultra-large scale integration (ULSI) semiconductor devices such as ULSI metal oxide silicon field effect transistors (MOSFETs).

BACKGROUND OF THE INVENTION

Semiconductor chips or wafers are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

A common circuit component of semiconductor chips is the transistor. In ULSI semiconductor chips, a transistor is established by forming a polysilicon gate on a silicon substrate, and then forming a source region and a drain region in the substrate beneath the gate by implanting appropriate dopant materials into the areas of the substrate that are to become the source and drain regions. The gate is insulated from the substrate by a thin gate oxide layer, with small portions of the source and drain regions, referred to as "extensions", extending toward and virtually under the gate.

Between the source and drain regions and under the gate oxide layer is a channel region, a portion of which is doped. The doped portion of the channel region typically is doped early in the fabrication process, with the channel dopant usually being implanted during the steps of forming the gate and source and drain regions. This generally-described structure cooperates to function as a transistor.

To suppress deleterious "short channel" effects such as threshold voltage roll-off (i.e., transistor operation at below intended voltages), it is important that the dopant profile of the channel be steep. Stated differently, it is important that virtually all of the dopant in the channel region be concentrated within a relatively small area that is to function as the doped portion of the channel, with little or no dopant being located outside this relatively small doped region between the small doped region and the source and drain regions. With this in mind, it is desirable that the dopant profile of the channel region be a so-called "super-steep retrograded channel" (SSRC) profile.

As recognized by the present invention, semiconductor fabrication entails considerable heating during processing. Accordingly, structures such as doped channel regions that are established relatively early in the process are exposed to more heat than are structures formed relatively late in the process. As further recognized herein, however, exposing a channel region that has been doped relatively early in the manufacturing process to subsequent heating steps can cause the dopant in the channel to thermally diffuse and, hence, can cause the dopant profile of the channel undesirably to spread. Fortunately, the present invention addresses this problem.

BRIEF SUMMARY OF THE INVENTION

A method for establishing a transistor on a semiconductor device includes providing a semiconductor substrate, and forming a source region and a drain region in the substrate. Also, a sacrificial gate is formed above the source and drain regions, without forming a doped channel region between the source and drain regions. Then, the sacrificial gate is removed and a neutral ion species is implanted in the substrate between the source and drain regions to define an amorphous region. A dopant is implanted in the amorphous region, and the amorphous region is then heated to activate the dopant and thereby establish a doped channel region. Following channel activation, a gate stack is established above the doped channel region.

In a preferred embodiment, the heating step is accomplished by heating the amorphous region to no more than nine hundred fifty degrees Celsius (950° C.), and more preferably to no more than nine hundred degrees Celsius (900° C.), by laser annealing. Specifically, the amorphous region is irradiated with a laser for no more than ten nanoseconds, and more preferably for no more than five nanoseconds, such that the temperature of the amorphous region does not exceed nine hundred fifty degrees Celsius (950° C.). A semiconductor device made according to the present method, and a digital processing apparatus incorporating the device, are also disclosed.

In another aspect, a method is disclosed for making an ultra-large scale integration (ULSI) semiconductor device. The method includes forming source and drain regions in a semiconductor substrate using a first activation temperature, and then forming a doped channel region between the source and drain regions using a second activation temperature less than the first activation temperature.

In still another aspect, a semiconductor device includes a semiconductor substrate, a transistor gate on the substrate, and source and drain regions in the substrate below the gate. A channel region is between the source region and the drain region. Also, an activated dopant implant is in the channel region, as is a neutral ion species implant.

Other features of the present invention are disclosed or apparent in the section entitled "DETAILED DESCRIPTION OF THE INVENTION".

DETAILED DESCRIPTION OF THE INVENTION

Figure 1:
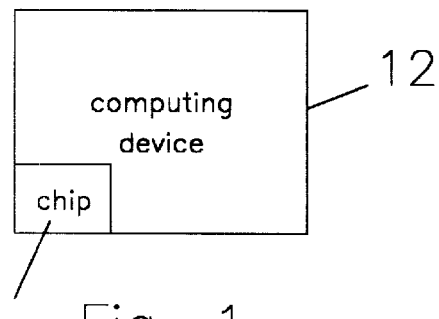
FIG. 1 is a schematic diagram of a semiconductor device made according to the present invention, shown in combination with digital processing apparatus.

Referring initially to FIG. 1, a semiconductor device embodied as a chip 10 is shown incorporated into a digital processing apparatus such as a computer 12. The chip 10 is made in accordance with the below disclosure.

Figure 2:
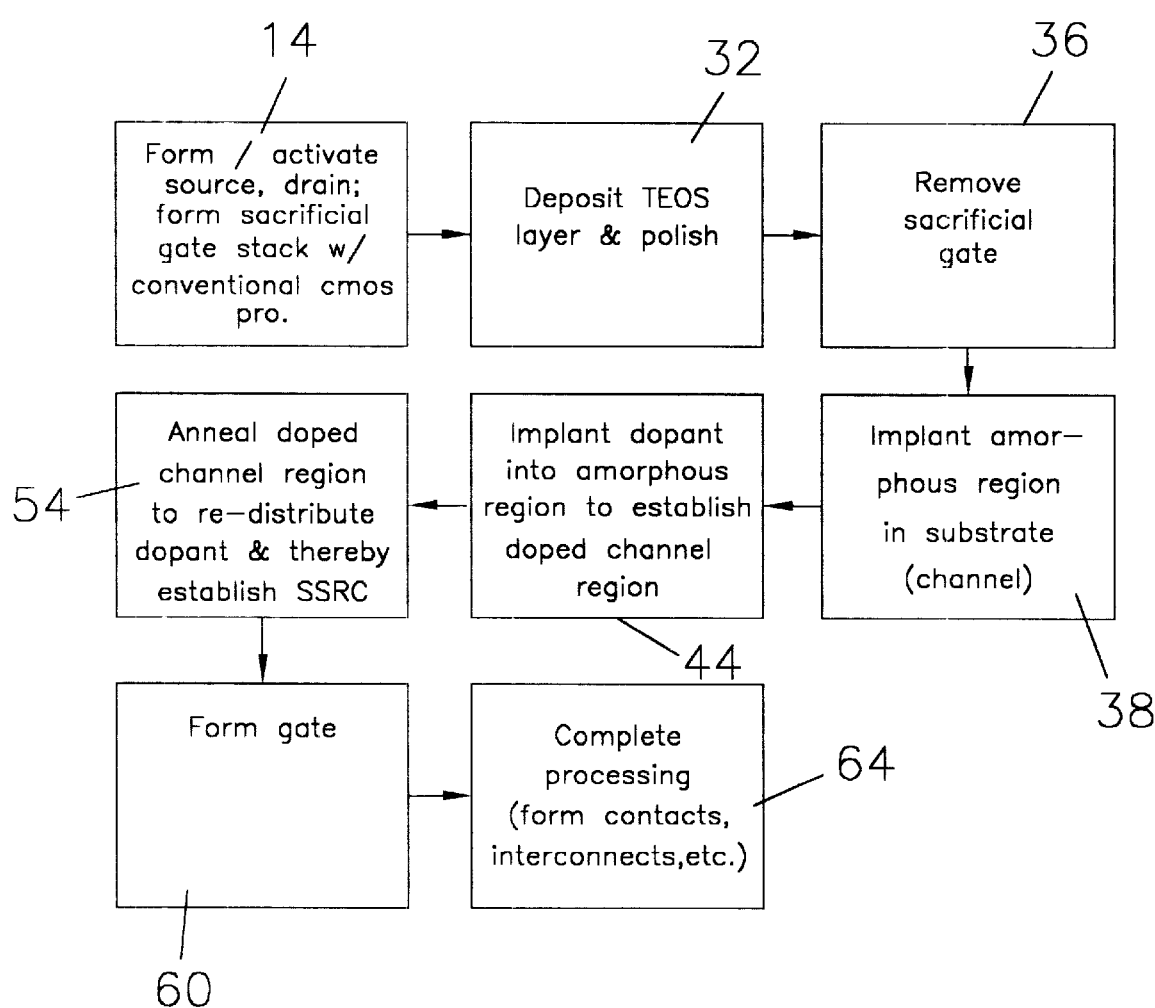
FIG. 2 is a flow chart showing the steps of the present invention.
Figure 3:
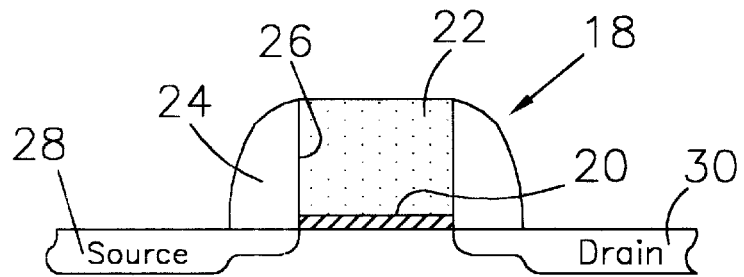
FIG. 3 is a side view of the device after forming the source and drain and sacrificial gate.

Now referring to FIGS. 2 and 3, as indicated at block 14 in FIG. 2 and as shown in FIG. 3, a silicon substrate 16 is provided. A sacrificial gate 18 also is formed on the silicon substrate 16 using conventional semiconductor fabrication techniques including low pressure chemical vapor deposition (LPCVD) and appropriate etching and lithography. As shown, the sacrificial gate 18 includes a thin insulating gate oxide layer 20 that faces the substrate 16 and a gate polysilicon stack 22 on the gate oxide layer 20. Additionally, nitride sidewall spacers 24 are deposited on the substrate 16 and etched in accordance with well-known principles to establish the illustrated shoulder configuration around the sides 26 of the gate 18 as shown. Activated source and drain regions 28, 30 are also formed in the substrate 16. The structure shown in FIG. 3 and described thus far is conventionally formed using temperatures of about one thousand degrees Celsius (1000° C.), with the exception that no doped channel region has been formed in the substrate 16 beneath the gate 18.

Figure 4:
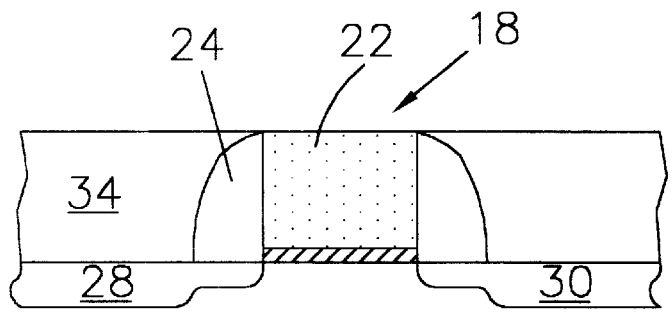
FIG. 4 is a side view of the device after TEOS layer deposition.
Figure 5:
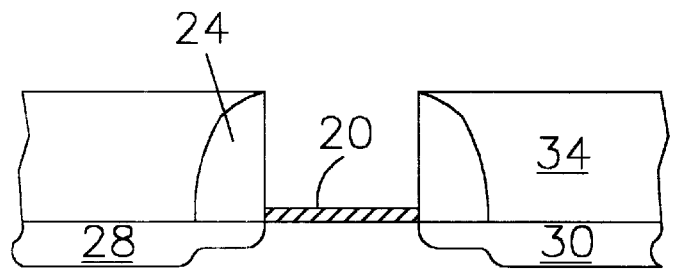
FIG. 5 is a side view of the device after the sacrificial gate has been removed.

Proceeding to block 32 in FIG. 2 and referring to FIG. 4, an oxide layer 34 is formed on the substrate 16 on both sides of the sacrificial gate 18. Preferably, the oxide layer 34 is tetraethoxy silane (TEOS). Then, as indicated at block 36 in FIG. 2 and as shown in FIG. 5, the polysilicon stack 22 of the sacrificial gate 18 is removed by, e.g., wet etching.

Figure 6:
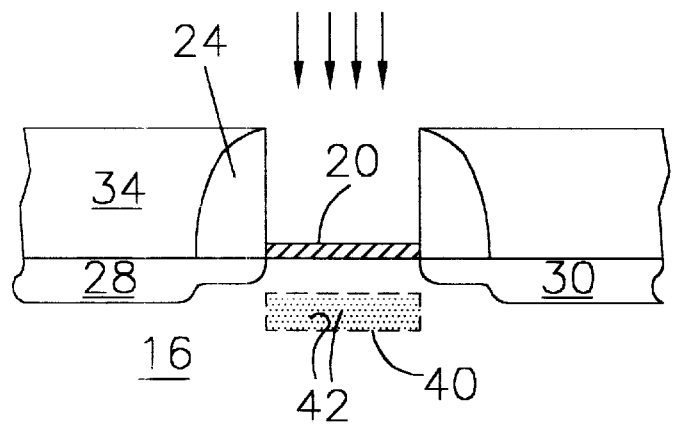
FIG. 6 is a side view of the device after implanting a neutral ion species in the substrate to establish the amorphous region.

Referring now to block 38 in FIG. 2 and considering FIG. 6, an amorphous region 40 in the substrate 16 is implanted with a neutral ion species 42. In one preferred embodiment, the neutral ion species 42 includes Silicon (Si) or Germanium (Ge). The implanting of the neutral ion species 42 precisely establishes the rectangular contour shown of the amorphized region 40. As an alternative to Silicon or Germanium, the neutral ion species 42 can be an ion of, e.g., Boron Fluoride ($BF_2$), Arsenic (As), Boron (B), or Phosphorous (P).

Figure 7:
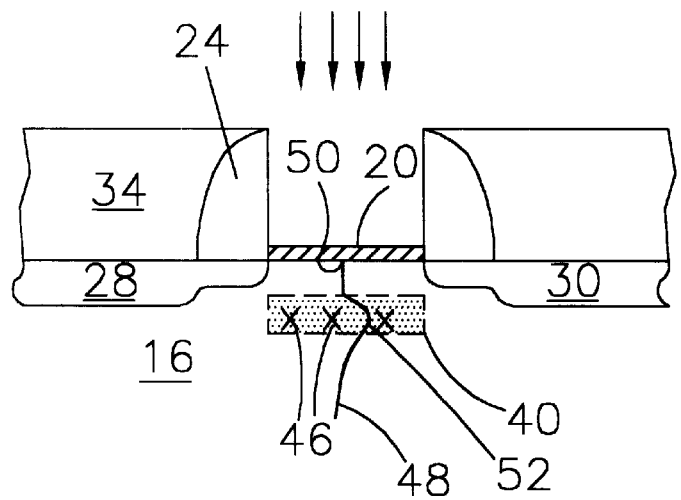
FIG. 7 is a side view of the device after implanting dopant into the amorphous region to establish a doped channel region.

Proceeding to block 44 in FIG. 2 and now considering FIG. 7, an appropriate dopant substance 46, represented by small "x"s in FIG. 7, is implanted into the substrate 16. It is to be understood that as shown, the dopant profile (represented by the line 48) in the portion of the substrate that includes the amorphized region 40 rises from a level of near zero at a point 50 near the surface of the substrate 16 to a peak 52 within the amorphized region 40, and then the dopant profile 48 tapers off deeper into the substrate 16.

Figure 8:
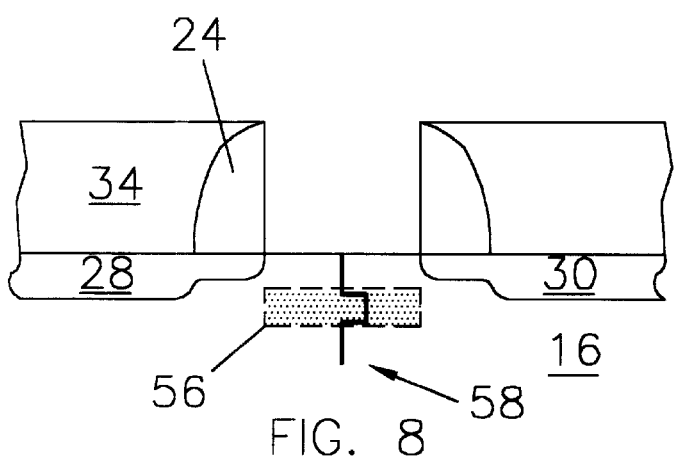
FIG. 8 is a side view of the device after annealing the doped channel region to establish a super-steep retrograded channel doping profile.
Figure 9:
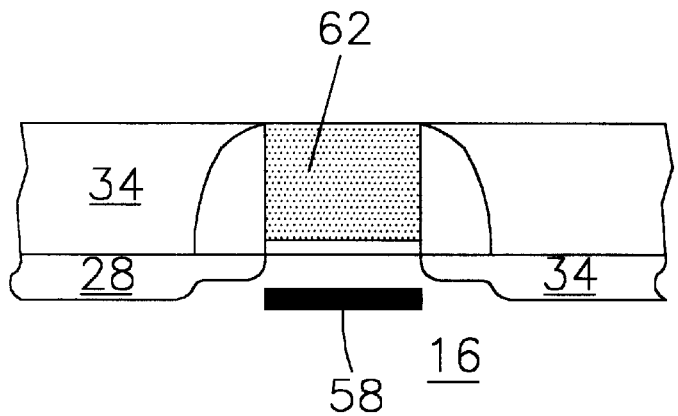
FIG. 9 is a side view of the device after forming the gate.

To render the desired box-like, super-steep retrograded channel (SSRC) dopant profile, the amorphous region 40 is annealed at block 54 in FIG. 2 to render an activated doped channel region 56, shown in FIG. 8, having the box-like SSRC profile 58 shown. More specifically, during heating, dopant in the substrate 16 that is near the doped channel region 56 is redistributed into the doped channel region 56, thus achieving a relatively constant dopant concentration in the doped channel region 56 as shown and a relatively constant, near-zero dopant concentration outside the channel region 58 between the source and drain regions 28, 30. During heating, the gate oxide layer 20 is removed.

In the presently preferred embodiment, the doped channel region 56 is heated to no more than nine hundred fifty degrees Celsius (950° C.), and more preferably to no more than nine hundred degrees Celsius (900° C.), by ultra-rapid laser annealing. To undertake this annealing, the channel portion 56 is irradiated by a laser for no more than ten nanoseconds, and more preferably for no more than five nanoseconds.

From block 54, the process moves to block 60, wherein a gate stack 62 is formed on the substrate 16 above the doped channel region 56. Processing, including the forming of contacts and interconnects, is completed at block 64.

While the particular METHOD FOR FORMING SUPER-STEEP RETROGRADED CHANNEL (SSRC) FOR CMOS TRANSISTOR USING RAPID LASER ANNEALING TO REDUCE THERMAL BUDGET as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". Indeed, although a single transistor structure is shown in the drawings for clarity, the skilled artisan will appreciate that the chip 10 can include plural transistors, each substantially identical to that shown, as well as other circuit components. All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for".

What is claimed is:

1. A method for establishing at least one transistor on a semiconductor device, comprising:

providing a semiconductor substrate;

forming a source region and a drain region in the substrate and a sacrificial gate above the source and drain regions, without forming a doped channel region between the source and drain regions; then removing the sacrificial gate;

implanting at least one neutral ion species in the substrate between the source and drain regions to define an amorphous region;

implanting at least one dopant in the amorphous region;

heating at least the amorphous region to activate the dopant and thereby establish a doped channel region; and forming a gate above the doped channel region.

2. The method of claim 1, wherein the heating step is accomplished by heating the amorphous region to no more than nine hundred fifty degrees Celsius (950° C.).

3. The method of claim 2, wherein the heating step is accomplished by heating the amorphous region to no more than nine hundred degrees Celsius (900° C.).

4. The method of claim 1, wherein the heating step is accomplished by laser annealing.

5. The method of claim 4, wherein the heating step is accomplished by irradiating the amorphous region with a laser for no more than ten nanoseconds.

6. The method of claim 5, wherein the heating step is accomplished by irradiating the amorphous region with a laser for no more than five nanoseconds.

7. The method of claim 4, wherein the heating step is accomplished by irradiating the amorphous region with a laser such that the temperature of the amorphous region does not exceed nine hundred fifty degrees Celsius (950° C.).

8. The method of claim 1, wherein the neutral ion species includes at least one of:

Silicon (Si) and Germanium (Ge).

9. A semiconductor device made according to claim 1.

10. A digital processing apparatus incorporating the device of claim 9.

* * * * *